(12) United States Patent
Ootsuka et al.

(10) Patent No.: US 7,239,542 B2
(45) Date of Patent: Jul. 3, 2007

(54) STORAGE APPARATUS

(75) Inventors: Wataru Ootsuka, Tokyo (JP);
Tomohito Tsushima, Kanagawa (JP);
Hidenari Hachino, Nagasaki (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 11/245,325

(22) Filed: Oct. 5, 2005

(65) Prior Publication Data
US 2006/0092685 A1 May 4, 2006

(30) Foreign Application Priority Data
Oct. 8, 2004 (JP) .......................... P2004-295502

(51) Int. Cl.
*G11C 11/00* (2006.01)
(52) U.S. Cl. ...................... 365/158; 365/171
(58) Field of Classification Search ................ 365/158, 365/171, 173
See application file for complete search history.

(56) References Cited

U.S. PATENT DOCUMENTS 6,724,651 B2 *  4/2004  Hirai ........................... 365/158
6,826,076 B2 * 11/2004  Asano et al. ................ 365/158
6,956,766 B2 * 10/2005  Nakamura et al. .......... 365/171
7,110,285 B2 *  9/2006  Inaba .......................... 365/158

* cited by examiner

*Primary Examiner*—Anh Phung
(74) *Attorney, Agent, or Firm*—Sonnenschein Nath & Rosenthal LLP

(57) ABSTRACT

The present invention provides a storage apparatus including a variable resistance element having a recording layer between two electrodes. In the variable resistance element, a resistance value of the recording layer is reversibly changed to one of a value in a high-resistance state and a value in a low-resistance state by applying potentials of different polarities to the two electrodes. An absolute value of a threshold value of an applied signal at a time of change from the high-resistance state to the low-resistance state and an absolute value of a threshold value of an applied signal at a time of change from the low-resistance state to the high-resistance state differ from each other. A reading signal for detecting the resistance value of the recording layer in the variable resistance element is applied with a polarity of one of the threshold values of the applied signals which one has a higher absolute value and with a value lower than the absolute value.

4 Claims, 5 Drawing Sheets

STORAGE APPARATUS

CROSS REFERENCES TO RELATED APPLICATIONS

The present invention contains subject matter related to Japanese Patent Application JP 2004-295502 filed in the Japanese Patent Office on Oct. 8, 2004, the entire contents of which being incorporated herein by reference.

BACKGROUND OF THE INVENTION

The present invention relates to a storage apparatus that has a variable resistance element in which the resistance value of a recording layer is changed reversibly by applying potentials of different polarities to two electrodes, and which stores information using a change in resistance of the variable resistance element.

Recently, with the dramatic spread of information communication devices, portable terminal devices and the like, higher performance such as a higher degree of integration, higher speed, lower power consumption and the like is required of elements such as a memory, a logic and the like forming these devices. Of such elements, nonvolatile memories, in particular, are considered to be essential in the ubiquitous age.

Nonvolatile memories enable protection of important information including personal information even when power supply exhaustion or trouble occurs, or a server and a network are disconnected due to some problem. Recent portable terminal devices are designed to minimize power consumption by setting an unused circuit block in a standby state. However, when a nonvolatile memory that can serve as a high-speed work memory and a high-capacity storage memory can be realized, wastes of power consumptions and memory can be eliminated. Further, when a high-speed and high-capacity nonvolatile memory can be realized, a so-called "instant on" function, which enables an instant start on turning on power, can also be realized.

Various nonvolatile memories have been proposed, and some nonvolatile memories, such as flash memories, for example, are put to practical use. On the other hand, a nonvolatile memory using a variable resistance element that stores information using a change in resistance has recently been proposed as a new-generation memory device that operates on a relatively low voltage, has a high storage density, and enables high-speed random access operation (see Japanese Patent Laid-open No. 2004-87069 and Japanese Translations of PCT for Patent No. 2002-536840, for example). The variable resistance element is formed such that a resistance value in the element is reversibly changed to a high resistance value or a low resistance value by applying potentials of different polarities to the element. Specifically, there are a variable resistance element using spin injection magnetization reversal as disclosed, for example, in Japanese Patent Laid-open No. 2004-87069 and a variable resistance element using mobile ions such as Ag and the like as disclosed, for example, in Japanese Translations of PCT for Patent No. 2002-536840.

SUMMARY OF THE INVENTION

In a nonvolatile memory (storage apparatus) formed with a variable resistance element, the variable resistance element has a recording layer interposed between two electrodes. Potentials of different polarities are applied to the two electrodes, or more specifically, a current (writing signal) higher than a state transition threshold value is made to flow from one electrode to the other electrode to set the recording layer interposed between these electrodes in a high-resistance state or a writing signal is made to flow in an opposite direction to set the recording layer in a low-resistance state, whereby information is written to the recording layer. That is, the high-resistance state or the low-resistance state is maintained unless a writing signal higher than a state transition threshold value is passed between the two electrodes, and thereby the recording layer stores 1-bit information on a nonvolatile basis. At a time of information reading, on the other hand, when a predetermined voltage or current (reading signal) is applied between the two electrodes, a voltage value or a current value that differs depending on whether the recording layer is in the high-resistance state or in the low-resistance state is obtained. Thus, by detecting this, stored 1-bit information is read from the recording layer. It is desirable from a viewpoint of stability (S/N or the like) at the time of reading that at this time, the reading signal applied between the two electrodes has a high magnitude (voltage value or current value).

However, in the storage apparatus formed with the variable resistance element, both the writing signal and the reading signal are applied similarly between the two electrodes in the variable resistance element. Hence, depending on relation between the magnitude of the reading signal and the state transition threshold value, erroneous writing may occur, or stored information may be destroyed.

The state transition threshold value in the variable resistance element generally has so-called hysteresis, in which the magnitude of the state transition threshold value at a time of a change from the high-resistance state to the low-resistance state and the magnitude of the state transition threshold value at a time of a change from the low-resistance state to the high-resistance state do not coincide with each other. Depending on characteristics of the recording layer, supposing that a state of no difference between the potentials applied to the electrodes (a zero potential difference) is set as a reference, a hysteresis loop made by the hysteresis is asymmetric with respect to the reference. When the hysteresis loop is asymmetric, the absolute value of the state transition threshold value at a time of a change from the high-resistance state to the low-resistance state and the absolute value of the state transition threshold value at a time of a change from the low-resistance state to the high-resistance state differ from each other.

When such an asymmetric hysteresis loop occurs, relation between the state transition threshold value and the magnitude of the reading signal is not the same, depending on the polarity of the potential applied between the two electrodes. Therefore, when erroneous writing, destruction of stored information and the like are to be suppressed, a sufficient signal level is not obtained, and thus stability at the time of reading may be degraded.

It is accordingly desirable to provide a storage apparatus that prevents erroneous writing, destruction of stored information and the like in reading information from a variable resistance element and enables sufficient stability at the time of the information reading to be ensured even when the variable resistance element whose state transition threshold values cause an asymmetric hysteresis loop is used.

According to an embodiment of the present invention, there is provided a storage apparatus including a variable resistance element having a recording layer between two electrodes. In the variable resistance element, a resistance value of the recording layer is reversibly changed to one of a value in a high-resistance state and a value in a low-resistance state by applying potentials of different polarities to the two electrodes, and an absolute value of a threshold value of an applied signal at a time of change from the high-resistance state to the low-resistance state and an absolute value of a threshold value of an applied signal at a time of change from the low-resistance state to the high-resistance state differ from each other, and a reading signal for detecting the resistance value of the recording layer in the variable resistance element is applied with a polarity of one of the threshold values of the applied signals which one has a higher absolute value and with a value lower than the absolute value.

According to an embodiment of the present invention, there is provided a storage apparatus including a plurality of variable resistance elements having a recording layer between two electrodes, one of the two electrodes being connected to a source line, and the other of the two electrodes being connected to a bit line via a selecting transistor. In each variable resistance element, a resistance value of the recording layer is reversibly changed to one of a value in a high-resistance state and a value in a low-resistance state by applying potentials of different polarities to the two electrodes. An absolute value of a threshold value of an applied signal at a time of change from the high-resistance state to the low-resistance state and an absolute value of a threshold value of an applied signal at a time of change from the low-resistance state to the high-resistance state differ from each other. At a time of information writing, by setting the source line to one of a reference voltage and a reference current and applying a writing signal having one of a different voltage value and a different current value to the bit line, potentials of different polarities are applied to the two electrodes in the variable resistance element selected by the selecting transistor, whereby the resistance value of the recording layer in the variable resistance element is changed. At a time of information reading, a reading signal for detecting the resistance value of the recording layer in the variable resistance element is applied to one of the source line and the bit line such that the reading signal is applied with a polarity of one of the threshold values of the applied signals which one has a higher absolute value and with a value lower than the absolute value, to the variable resistance element selected by the selecting transistor.

In both of the thus formed storage apparatuses, the reading signal for detecting the resistance value of the recording layer in the variable resistance element is applied with a polarity of one of the threshold values of the applied signals which one has a higher absolute value and with a value lower than the absolute value. Therefore the magnitude of the reading signal does not exceed the threshold value of the applied signal at the time of change from the high-resistance state to the low-resistance state, and does not exceed the threshold value of the applied signal at the time of change from the low-resistance state to the high-resistance state. In addition, since the reading signal is applied with the polarity of one of the threshold values of the applied signals which one has the higher absolute value, the magnitude of the reading signal can be set higher as compared with a case where the reading signal is applied with the polarity of the threshold value of the applied signal having a lower absolute value.

As described above, in the storage apparatuses according to the embodiments of the present invention, the magnitude of the reading signal for the variable resistance element does not exceed the threshold values (state transition threshold values) of the applied signals for changing the recording layer between the high-resistance state and the low-resistance state, and can be set high in a range in which the magnitude of the reading signal does not exceed the state transition threshold value. Thus, even when a variable resistance element whose state transition threshold values cause an asymmetric hysteresis loop is used, erroneous writing, destruction of stored information and the like do not occur in reading information from the variable resistance element, and sufficient stability at the time of the information reading can be ensured.

DETAILED DESCRIPTION OF THE PREFERRED EMBODIMENTS

Preferred embodiments of a storage apparatus according to the present invention will hereinafter be described with reference to the drawings.

First Embodiment

A first embodiment of a storage apparatus according to the present invention will first be described. Description in this case will be made by taking a device that stores information using spin injection magnetization reversal as an example of a variable resistance element.

Figure 1:
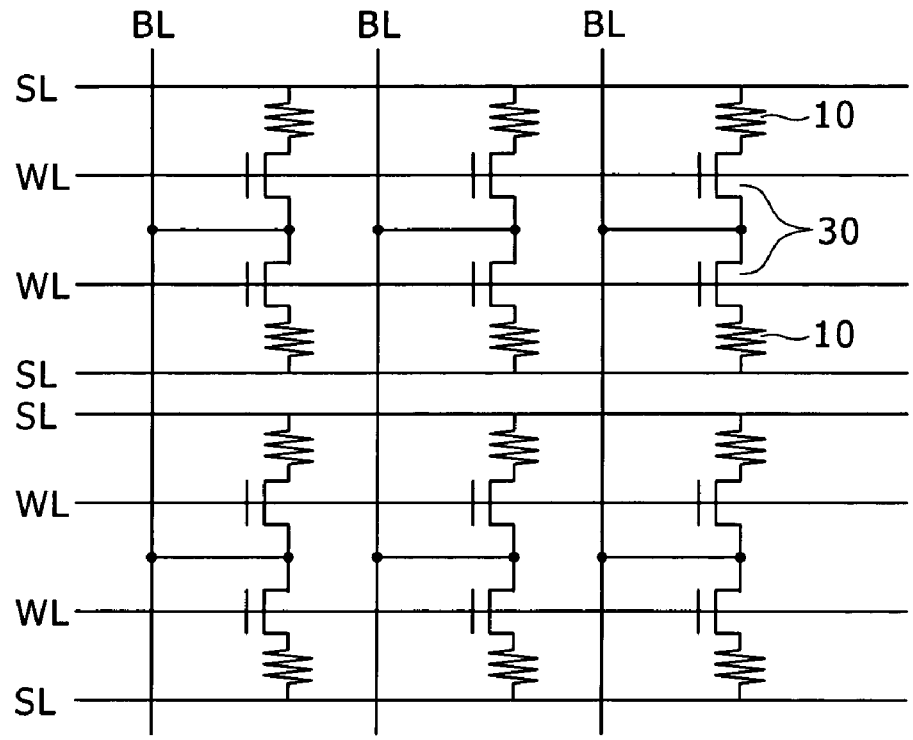
FIG. 1 is a circuit diagram schematically showing an example of configuration of a storage apparatus according to an embodiment of the present invention.

FIG. 1 is a circuit diagram schematically showing an example of configuration of the storage apparatus according to the first embodiment of the present invention.

As illustrated in the figure, the storage apparatus described in the first embodiment has a plurality of variable resistance elements 10 arranged in the form of a matrix. The storage apparatus further includes a selecting transistor 30 in such a manner as to correspond to each variable resistance element 10, the selecting transistor 30 functioning as an element for controlling the variable resistance element 10. A bit line BL as a data signal line is disposed in each column in the matrix. A source line SL as a common line and a word line WL as a control element signal line are disposed in each row in the matrix.

With such a configuration of the storage apparatus, a variable resistance element 10 at an intersection of one selected bit line BL and one selected word line WL is selected.

Figure 2:
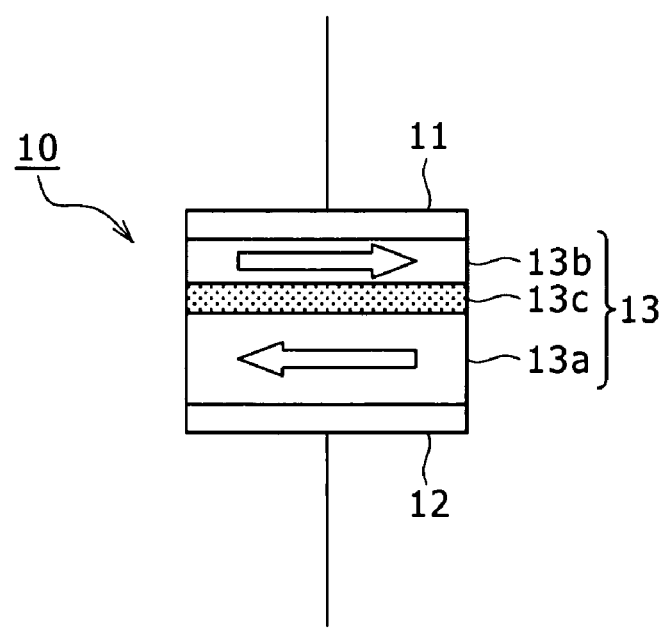
FIG. 2 is a diagram of assistance in explaining an example of general structure of a variable resistance element in a first embodiment of a storage apparatus according to the present invention.

FIG. 2 is a diagram of assistance in explaining an example of general structure of a variable resistance element.

As illustrated in the figure, the variable resistance element 10 described in the first embodiment has a recording layer 13 between two electrodes 11 and 12. The recording layer 13 includes: a fixed layer 13a as a magnetic layer in which a direction of magnetization is fixed; a free layer 13b as a magnetic layer in which a direction of magnetization is changed; and a non-magnetic layer 13c interposed between the fixed layer 13a and the free layer 13b. The fixed layer 13a and the free layer 13b are formed by a magnetic material such as CoFe and the like or a laminated ferri-structure using these magnetic materials. The non-magnetic layer 13c is formed by an insulating layer of $Al_2O_3$, MgO, or the like or a conductive layer of Cu or the like.

In the thus formed variable resistance element 10, the recording layer 13 is in a low resistance state when the direction of magnetization in the fixed layer 13a is the same as the direction of magnetization in the free layer 13b, and the recording layer 13 is in a high resistance state when the direction of magnetization in the fixed layer 13a is different from the direction of magnetization in the free layer 13b. The direction of magnetization in the free layer 13b is changed by passing a current higher than a state transition threshold value in a direction in which the layers 13a, 13b, and 13c of the recording layer 13 are laminated (a vertical direction in the figure). Specifically, when a current higher than the state transition threshold value flows in a direction from the bottom to the top of FIG. 2, the direction of magnetization in the free layer 13b is the same as in the fixed layer 13a (parallel with the direction of magnetization in the fixed layer 13a). When a current higher than the state transition threshold value flows in a direction from the top to the bottom of FIG. 2, the direction of magnetization in the free layer 13b is different from the direction of magnetization in the fixed layer 13a, and is opposite from the direction of magnetization in the fixed layer 13a (non-parallel with the direction of magnetization in the fixed layer 13a). That is, the variable resistance element 10 stores 1-bit information on a nonvolatile basis using spin injection magnetization reversal.

Figure 3:
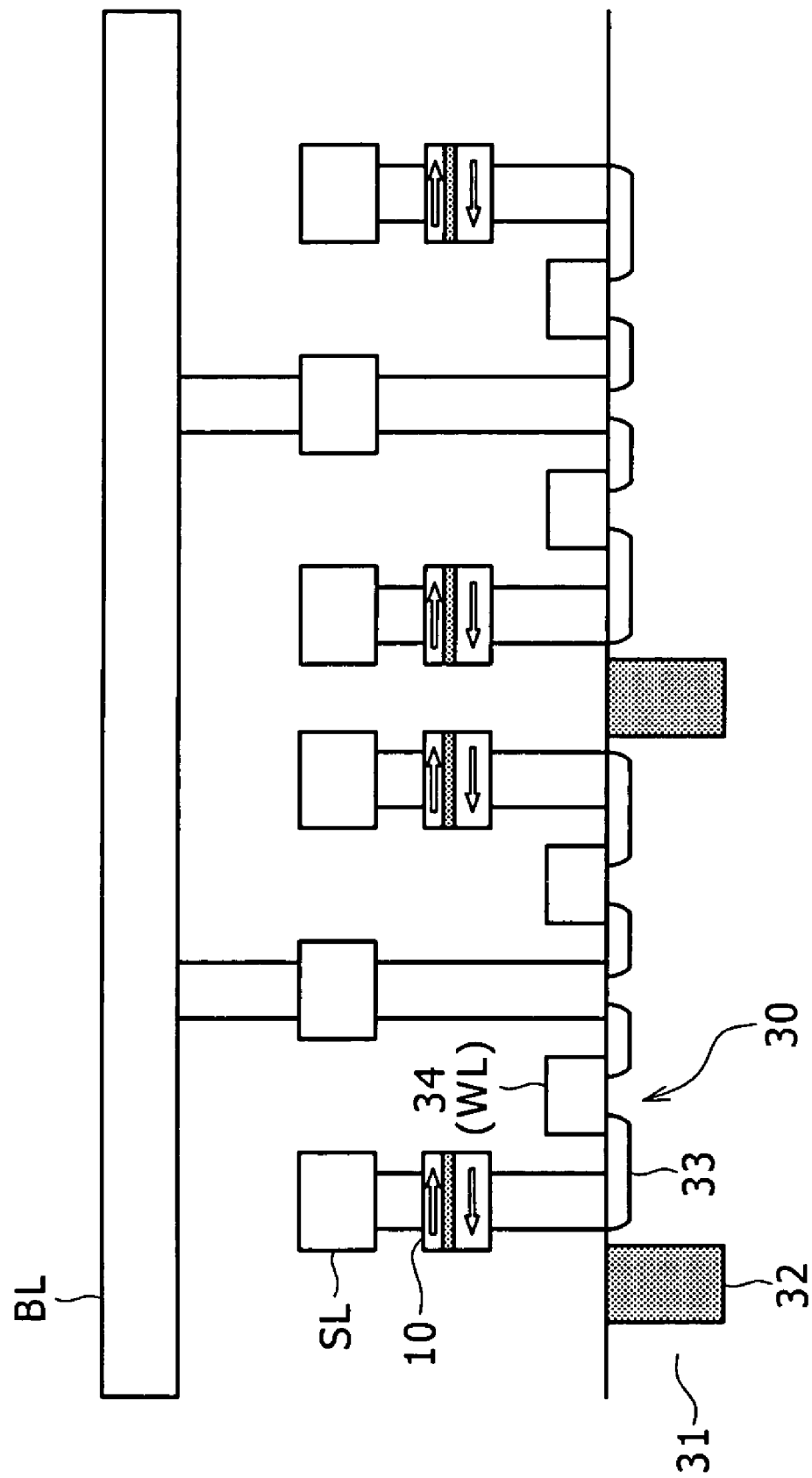
FIG. 3 is a diagram of assistance in explaining an example of sectional structure of the storage apparatus according to the first embodiment of the present invention.

FIG. 3 is a diagram of assistance in explaining an example of sectional structure of the storage apparatus according to the first embodiment of the present invention.

As illustrated in the figure, each variable resistance element 10 in the storage apparatus described in the first embodiment is formed above the selecting transistor 30 formed in a semiconductor substrate 31. The electrode 12 on the fixed layer 13a side of the variable resistance element 10, that is, the lower electrode 12 is electrically connected to the selecting transistor 30. The electrode 11 on the free layer 13b side of the variable resistance element 10, that is, the upper electrode 11 is electrically connected to the source line SL.

The selecting transistor 30 is a MOS transistor including source/drain regions 33 formed in a region separated by a device separating layer 32 within the semiconductor substrate 31, and a gate electrode 34. Of these, the gate electrode 34 also serves as word line WL. One of the source/drain regions 33 is electrically connected to the lower electrode 12 of the variable resistance element 10 via a plug layer, a metallic wiring layer or the like. The other source/drain region 33 is electrically connected to the bit line BL via a plug layer, a metallic wiring layer or the like.

Incidentally, as a procedure for forming such a laminated structure, a known semiconductor process may be used, and thus description thereof will be omitted.

Figure 4:
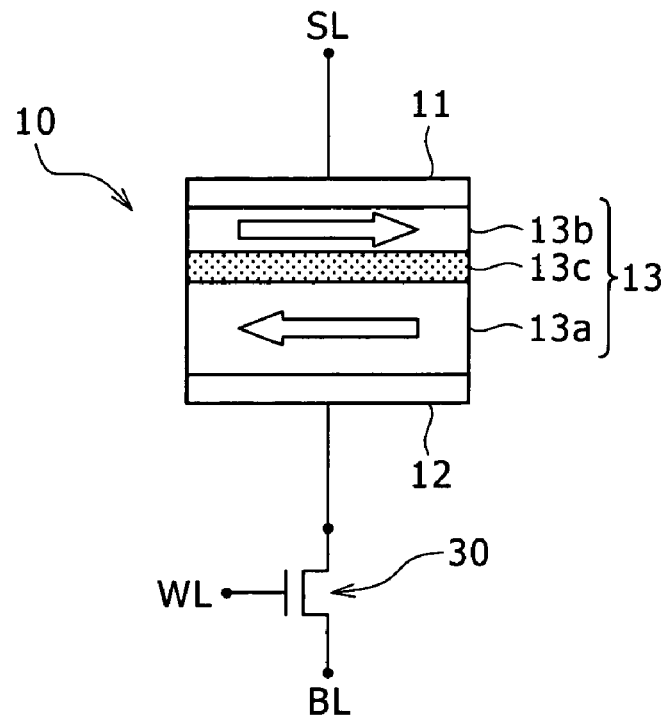
FIG. 4 is a circuit diagram showing an example of structure of one memory cell part in the first embodiment of the storage apparatus according to the present invention.

FIG. 4 is a circuit diagram showing an example of structure of one memory cell part in the storage apparatus according to the first embodiment of the present invention. That is, FIG. 4 shows electric connection of component parts (memory cell part) of one variable resistance element 10 in the sectional structure shown in FIG. 3.

As illustrated in the figure, in each memory cell part in the storage apparatus described in the first embodiment, one electrode (upper electrode) 11 in the variable resistance element 10 is connected to a source line SL, and another electrode (lower electrode) 12 is connected to a bit line BL via a selecting transistor 30.

Process operations of the storage apparatus thus formed will next be described by taking a time of information reading and a time of information writing as examples.

At the time of information writing, the source line SL is set to a reference voltage or a reference current, and a writing signal having a different voltage value or a different current value is applied to the bit line BL, whereby potentials of different polarities are applied to the two electrodes 11 and 12 in the variable resistance element 10 selected by the selecting transistor 30. Thus, the resistance value of a recording layer 13 in the variable resistance element 10 is changed to write 1-bit information.

Specifically, when the gate of the selecting transistor 30 is brought into an on state by a word line WL, and a voltage is applied to the bit line BL, the voltage is applied to the lower electrode 12 in the variable resistance element 10 connected to the selecting transistor 30 via the source and drain of the selecting transistor 30.

At this time, when the polarity of the voltage applied to the lower electrode 12 is negative as compared with a reference potential in the source line SL, a current flows from the upper electrode 11 to the lower electrode 12 in the variable resistance element 10. When the magnitude of the current exceeds a state transition threshold value $I(P \rightarrow AP)$ uniquely defined from characteristics of the variable resistance element 10, a direction of magnetization in a free layer 13b in the variable resistance element 10 is opposite from a fixed layer 13a (non-parallel with a direction of magnetization in the fixed layer 13a).

On the other hand, when the polarity of the voltage applied to the lower electrode 12 is positive as compared with the reference potential in the source line SL, a current flows from the lower electrode 12 to the upper electrode 11 in the variable resistance element 10. When the magnitude of the current exceeds a state transition threshold value $I(P \rightarrow AP)$ uniquely defined from characteristics of the variable resistance element 10, the direction of magnetization in the free layer 13b in the variable resistance element 10 is the same as the fixed layer 13a (parallel with the direction of magnetization in the fixed layer 13a).

However, the state transition threshold value $I(P \rightarrow AP)$ and the state transition threshold value $I(P \rightarrow AP)$ are not equal to each other in magnitude, and have hysteresis. In addition, supposing that a state of no difference between the potentials applied to the electrodes 11 and 12 (a zero potential difference) is set as a reference, a hysteresis loop made by the hysteresis is asymmetric with respect to the reference.

Figure 5:
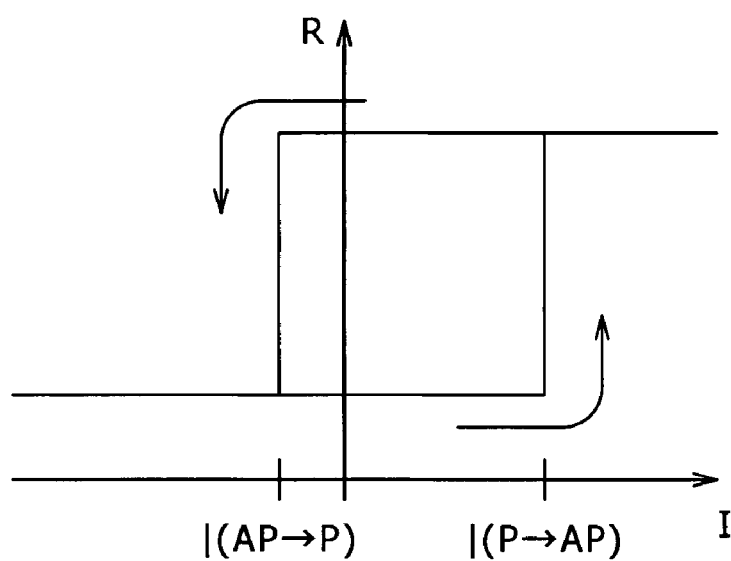
FIG. 5 is a diagram of assistance in explaining a concrete example of a hysteresis loop in the first embodiment of the storage apparatus according to the present invention, and shows a V-R curve in the variable resistance element shown in FIG. 2.

FIG. 5 shows a V-R curve in the variable resistance element shown in FIG. 2, and is a diagram of assistance in explaining a concrete example of the hysteresis loop. Incidentally, it is supposed in the example shown in the figure that a current flowing from the top to the bottom of FIG. 2 is of positive polarity.

As illustrated in the figure, when the hysteresis loop is asymmetric, the magnitude of an absolute value of a state transition threshold value I(AP→P) and the magnitude of an absolute value of a state transition threshold value I(P→AP) differ from each other.

Generally, according to a spin injection magnetization reversal current equation, the state transition threshold value $I_c^+$ of positive polarity is represented by Equation (1) shown in the following, and the state transition threshold value $I_c^-$ of negative polarity is represented by Equation (2) shown in the following.

[Equation 1]

$$I_c^+ \equiv I_c^{P \to AP} = e\alpha\gamma[H_{ext}+H_{an}+2\pi M_s]S_2/g(0) \qquad (1)$$

[Equation 2]

$$I_c^- \equiv I_c^{AP \to P} = e\alpha\gamma[H_{ext}-H_{an}-2\pi M_s]S_2/g(\pi) \qquad (2)$$

where e is an electron charge, α is a phenomenological Gilbert damping parameter, γ is a gyromagnetic ratio, $H_{ext}$ is an external field, $H_{an}$ is an anisotropy field of the memory cell, $M_s$ is magnetization, $S_2$ is the number of magnetic moment, and g(0) and g(π) are efficiency, which is determined by a function g(θ) represented as the following Equation (3).

Figure 6:
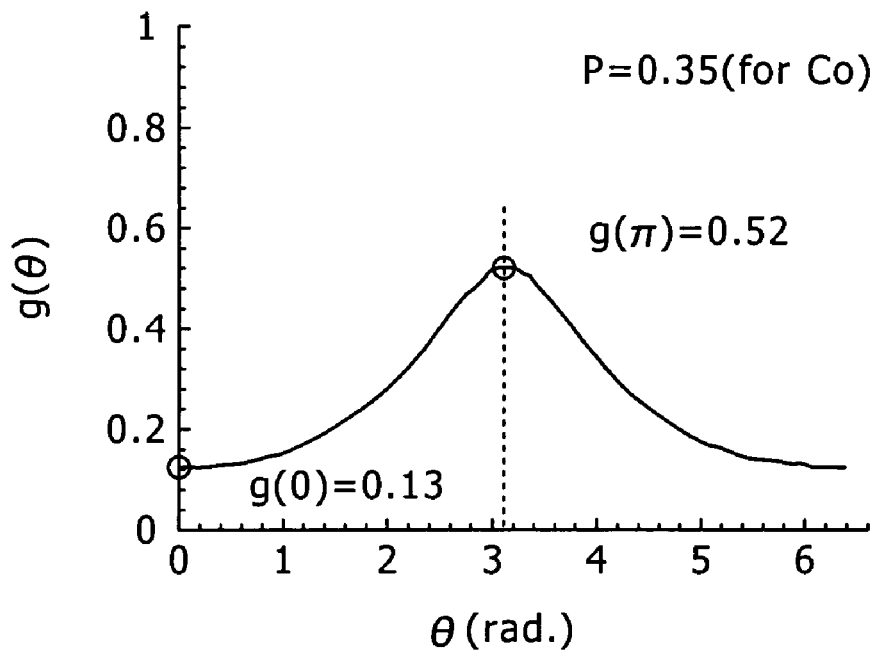
FIG. 6 is a diagram conceptually representing principles related to a spin injection magnetization reversal current equation.

[Equation 3]

$$g(\theta)=[-4+(P^{1/2}+P^{-1/2})^3(3+\cos\theta)/4]^{-1} \qquad (3)$$

where P is a polarizing factor, and θ is an included angle between two magnetization vectors. FIG. 6 represents the function g(θ) expressed as Equation (3) on coordinates with an axis of ordinates indicating the function g(θ) and an axis of abscissas indicating θ.

According to Equations (1) to (3) and what is shown in FIG. 6, that is, principles related to the spin injection magnetization reversal current equation, g(0)<g(π), and thus the absolute value of the state transition threshold value I(AP→P) and the absolute value of the state transition threshold value I(P→AP) have a characteristic of |I(AP→P)|<|I(P→AP)|.

That is, at the time of information writing, one of a potential that is a negative potential in relation to the reference potential in the source line SL and which makes the magnitude of a current flowing between the electrodes 11 and 12 of the variable resistance element 10 exceed |I(P→AP)| and a potential that is a positive potential in relation to the reference potential in the source line SL and which makes the magnitude of a current flowing between the electrodes 11 and 12 of the variable resistance element 10 exceed |I(AP→P)| is selectively applied to the bit line BL, whereby the resistance value of the recording layer 13 in the variable resistance element 10 is reversibly changed to write 1-bit information.

At the time of information reading, on the other hand, a predetermined voltage or current (reading signal) is applied to the variable resistance element 10 selected by the selecting transistor 30 through the source line SL or the bit line BL, and a current value or a voltage value that differs depending on a state of resistance of the variable resistance element 10 is detected via a sense amplifier connected to an end of the bit line BL or the source line SL. Thus, since a result of the detection differs depending on whether the recording layer 13 in the variable resistance element 10 is in a state of high resistance or in a state of low resistance, the 1-bit information stored in the recording layer 13 can be read.

However, at this time, the voltage value or the current value of the reading signal applied to the selected variable resistance element 10 is set such that the reading signal is applied with a polarity of one of the state transition threshold value I(P→AP) and the state transition threshold value I(AP→P) which one has a higher absolute value and with a value lower than the higher absolute value. Then, the reading signal is applied to the source line SL or the bit line BL.

Specifically, since |I(AP→P)|<|I(P→AP)| as described above, a reading signal that has a polarity when a potential exceeding the state transition threshold value I(P→AP) is applied to the variable resistance element 10, or more specifically a polarity when a current flows from the upper electrode 11 to the lower electrode 12 in the variable resistance element 10, and which has a value lower than the absolute value of the state transition threshold value I(P→AP) is applied to the source line SL or the bit line BL.

Incidentally, a method of setting the magnitude of the reading signal may be a conventional method, and therefore description thereof will herein be omitted.

When information is read from the variable resistance element 10 using the thus set reading signal, since the magnitude of the reading signal is lower than the absolute value of the state transition threshold value I(P→AP), the magnitude of the reading signal does not exceed the state transition threshold value I(P→AP). In addition, because the polarity of the reading signal is different from that of the state transition threshold value I(AP→P), the magnitude of the reading signal does not exceed the state transition threshold value I(AP→P).

Thus, erroneous writing, destruction of stored information or the like does not occur in the recording layer 13 of the variable resistance element 10 when the information is read from the variable resistance element 10.

In addition, since the reading signal is applied with the polarity of one of the state transition threshold value I(P→P) and the state transition threshold value I(AP→P) which one has the higher absolute value, the magnitude of the reading signal can be set higher as compared with a case where the reading signal is applied with the polarity of the state transition threshold value having a lower absolute value. That is, when |I(AP→P)|<|I(P→P)|, it suffices for the magnitude of the reading signal not to exceed |I(P→P)|, and because the polarity of the reading signal is different from that of the state transition threshold value I(AP→P), the magnitude of the reading signal exceeding |I(AP→P)| does not present a problem.

Thus, even when the state transition threshold value I(AP→P) and the state transition threshold value I(P→AP) do not coincide with each other, and an asymmetric hysteresis loop occurs, the magnitude of the reading signal can be set to a maximum in a range in which the magnitude of the reading signal does not exceed the state transition threshold value of the same polarity. That is, even when the hysteresis loop is asymmetric, it is possible to obtain a sufficient signal level at the time of information reading while avoiding erroneous writing of information, destruction of stored information or the like in the variable resistance element 10. Therefore sufficient safety at the time of information reading can be ensured.

Second Embodiment

A second embodiment of a storage apparatus according to the present invention will next be described. Description in the following will be made by taking as an example a case where variable resistance elements store information using mobile ions. However, description will be made mainly of differences from the foregoing first embodiment, and description of the same points will be omitted.

The storage apparatus described in the second embodiment has variable resistance elements different from those of the first embodiment.

Figure 7:
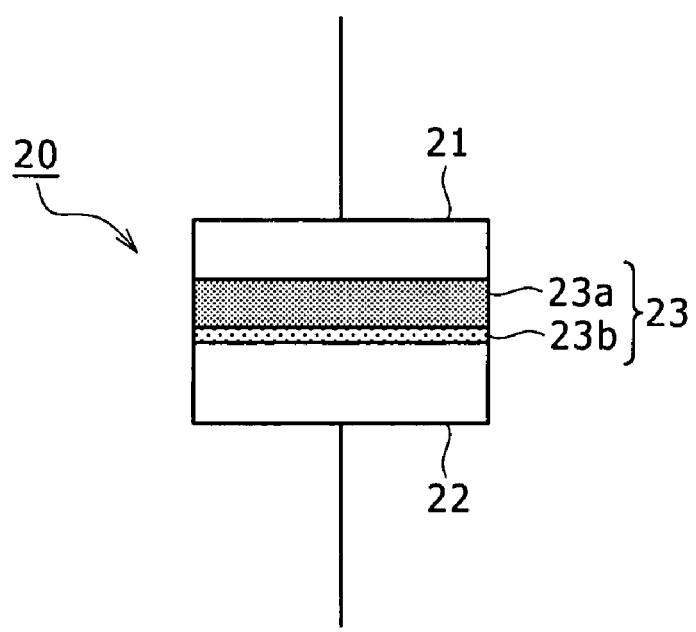
FIG. 7 is a diagram of assistance in explaining an example of general structure of a variable resistance element in a second embodiment of a storage apparatus according to the present invention.

FIG. 7 is a diagram of assistance in explaining an example of general structure of a variable resistance element.

As illustrated in the figure, the variable resistance element 20 described in the second embodiment has a recording layer 23 between two electrodes 21 and 22. The recording layer 23 includes an ion source layer 23a and a high-resistance film 23b.

The ion source layer 23a includes one or more kinds of element (metallic element) selected from Ag, Cu, and Zn and one or more kinds of element (chalcogenide element) selected from S, SO, and Te. The ion source layer 23a is to change a resistance value in the recording layer 23 by ionization of the metallic element. That is, the metallic elements (Ag, Cu, and Zn) serve as an ion source. Specifically, it is considered that a CuTeGeGd film, for example, is used as the ion source layer 23a. Although the resistivity of the CuTeGeGd film depends on the composition of the CuTeGeGd film, because Cu, Te, and Gd are metallic elements, it is easy to lower the resistance of the CuTeGeGd film as compared with a case where S or Se is used as chalcogenide.

In an amorphous chalcogenide thin film, GeTe has a very low resistivity of about $1 \times 10^4$ Ωcm. On the other hand, for example, GeSe has a resistivity of about $1 \times 10^{13}$ Ωcm, and GeSTe has a resistivity of about $1 \times 10^{11}$ Ωcm. Thus, the resistance can be lowered by including metals such as Cu and Gd or the like in a material having GeTe as a base material or a material including Te. A CuTeGeGd film having a thickness of 20 nm and a cell area of 0.4 $\mu m^2$, for example, can have a resistance value of about 100 Ω or lower.

The high-resistance film 23b is formed by using a material having a higher resistivity than the ion source layer 23a, such for example as an insulator or a semiconductor. For the high-resistance film 23b, materials such for example as a silicon oxide, a silicon nitride, a rare-earth oxide film, a rare-earth nitride film, amorphous silicon, amorphous germanium, and an amorphous chalcogenide can be used.

In the thus formed variable resistance element 20, when the metallic element (for example Ag, Cu, or Zn) as an ion source included in the ion source layer 23a is injected as ions into the high-resistance film 23b, or is deposited on a surface of the high-resistance film 23b, an interfacial state of the high-resistance film 23b changes, and the resistance value in the recording layer 23 becomes low. When ions move to a side farther from the high-resistance film 23b, the resistance value in the recording layer 23 becomes high. Ion movement is changed by passing a current higher than a state transition threshold value in a direction in which the layers 23a and 23b of the recording layer 23 are laminated (a vertical direction in the figure). Specifically, when a current higher than the state transition threshold value flows in a direction from the top to the bottom of FIG. 7, ions are injected into the high-resistance film 23b, or are deposited on the surface of the high-resistance film 23b. When a current higher than the state transition threshold value flows in a direction from the bottom to the top of FIG. 7, ions move to the side farther from the high-resistance film 23b.

Thus, the variable resistance element 20 stores 1-bit information on a nonvolatile basis using mobile ions. A reversible change is made between a high-resistance state and a low-resistance state according to presence or absence of a connection of the Ag, Cu, or Zn metal, and according to principles thereof, the resistance value is changed by a few orders of magnitude (by one order of magnitude or more) between the high-resistance state and the low-resistance state. As for state transition threshold values for reversal from the high-resistance state to the low-resistance state and from the low-resistance state to the high-resistance state, the state transition threshold value when a transition is made from the high-resistance state to the low-resistance state and the state transition threshold value when a transition is made from the low-resistance state to the high-resistance state are about 0.3 V and about −0.3 V, respectively.

Figure 8:
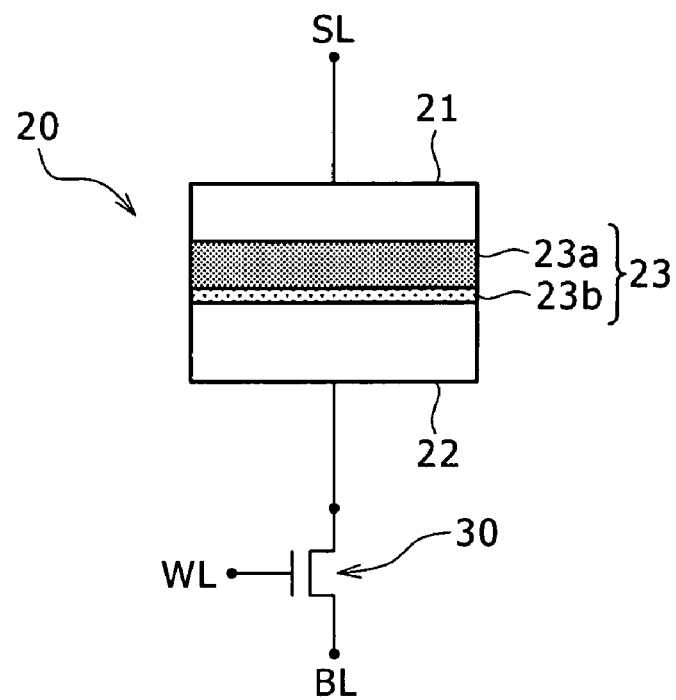
FIG. 8 is a circuit diagram showing an example of structure of one memory cell part in the second embodiment of the storage apparatus according to the present invention.

FIG. 8 is a circuit diagram showing an example of structure of one memory cell part.

Also in the storage apparatus according to the second embodiment, in each memory cell part, an electrode 22 on a high-resistance film 23b side of a variable resistance element 20, that is, a lower electrode 22 is connected to a bit line BL via a selecting transistor 30, and an electrode 21 on an ion source layer 23a side of the variable resistance element 20, that is, an upper electrode 21 is electrically connected to a source line SL.

Process operations of the storage apparatus thus formed will next be described by taking a time of information reading and a time of information writing as examples.

At the time of information writing, the source line SL is set to a reference voltage or a reference current, and a writing signal having a different voltage value or a different current value is applied to the bit line BL, whereby potentials of different polarities are applied to the two electrodes 21 and 22 in the variable resistance element 20 selected by the selecting transistor 30. Thus, the resistance value of a recording layer 23 in the variable resistance element 20 is changed to write 1-bit information.

Specifically, when the gate of the selecting transistor 30 is brought into an on state by a word line WL, and a voltage is applied to the bit line BL, the voltage is applied to the lower electrode 22 in the variable resistance element 20 connected to the selecting transistor 30 via the source and drain of the selecting transistor 30.

At this time, when the polarity of the voltage applied to the lower electrode 22 is negative as compared with a reference potential in the source line SL, a current flows from the upper electrode 21 to the lower electrode 22 in the variable resistance element 20. When the magnitude of the current exceeds a state transition threshold value uniquely defined from characteristics of the variable resistance element 20, ions in the ion source layer 23a of the variable resistance element 20 move, and the ions are injected into the high-resistance film 23b or are deposited on a surface of the high-resistance film 23b.

On the other hand, when the polarity of the voltage applied to the lower electrode 22 is positive as compared with the reference potential in the source line SL, a current flows from the lower electrode 22 to the upper electrode 21 in the variable resistance element 20. When the magnitude of the current exceeds a state transition threshold value uniquely defined from characteristics of the variable resistance element 20, ions in the ion source layer 23 a move to a side farther from the high-resistance film 23b in the variable resistance element 20.

However, also in the case of the storage apparatus according to the second embodiment, the state transition threshold value has hysteresis. Supposing that a state of no difference between the potentials applied to the electrodes 21 and 22 (a zero potential difference) is set as a reference, a hysteresis loop made by the hysteresis is asymmetric with respect to the reference.

Figure 9:
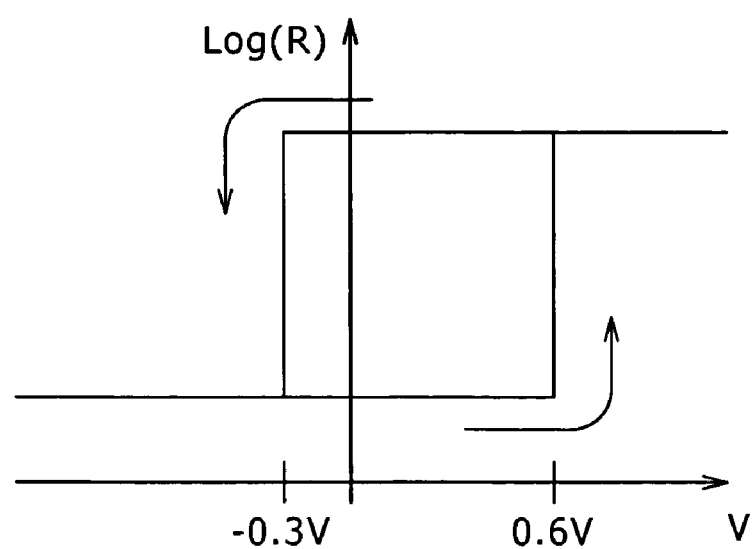
FIG. 9 is a diagram of assistance in explaining a concrete example of a hysteresis loop in the second embodiment of the storage apparatus according to the present invention, and shows a V-R curve in the variable resistance element shown in FIG. 7.

FIG. 9 shows a V-R curve in the variable resistance element shown in FIG. 7, and is a diagram of assistance in explaining a concrete example of the hysteresis loop.

Supposing that the resistance value in the recording layer 23 is 1 kΩ in a low-resistance state and 100 kΩ in a high-resistance state, for example, because of the characteristic of a large amount of change in the resistance value by one order of magnitude or more, an apparent value of the state transition threshold value varies from a viewpoint of voltage division by resistance with the selecting transistor 30. Supposing that the resistance value of the selecting transistor 30 is 1 kΩ, for example, for simplicity, the apparent value is expressed by the following Equation (4) and Equation (5).

[Equation 4]
$$V_{th0\_actual} = \frac{R_{tr} + R_1}{R_1} V_{th0} = \frac{1+100}{100}(-0.3) \approx -0.3 \quad (4)$$

[Equation 5]
$$V_{th1\_actual} = \frac{R_{tr} + R_0}{R_0} V_{th1} = \frac{1+1}{1}(0.3) = 0.6 \quad (5)$$

where $V_{th0\ actual}$ and $V_{th1\ actual}$ are an apparent state transition threshold value, $R_{tr}$ is the resistance value of the selecting transistor 30, $R_0$ is the resistance value of the recording layer 23 in the low-resistance state, $R_1$ is the resistance value of the recording layer 23 in the high-resistance state, and $V_{th0}$ and $V_{th1}$ are a state transition threshold value in the variable resistance element 20.

Thus, because of the characteristic of a large amount of change in the resistance value of the recording layer 23 by one order of magnitude or more, the apparent state transition threshold value for changing from the low-resistance state to the high-resistance state is 0.6 V.

Thus, at the time of information writing, one of a potential that is a negative potential in relation to the reference potential in the source line SL and whose magnitude exceeds the apparent state transition threshold value $V_{th0\ actual}$ of −0.3 V and a potential that is a positive potential in relation to the reference potential in the source line SL and whose magnitude exceeds the apparent state transition threshold value $V_{th1\ actual}$ of 0.6 V is selectively applied to the bit line BL, whereby the resistance value of the recording layer 23 in the variable resistance element 20 is reversibly changed to write 1-bit information.

At the time of information reading, on the other hand, a predetermined voltage or current (reading signal) is applied to the variable resistance element 20 selected by the selecting transistor 30 through the source line SL or the bit line BL, and a current value or a voltage value that differs depending on a state of resistance of the variable resistance element 20 is detected via a sense amplifier connected to an end of the bit line BL or the source line SL. Thus, since a result of the detection differs depending on whether the recording layer 23 in the variable resistance element 20 is in the high-resistance state or in the low-resistance state, the 1-bit information stored in the recording layer 23 can be read.

However, at this time, the voltage value or the current value of the reading signal applied to the selected variable resistance element 20 is set such that the reading signal is applied with a polarity of one of the apparent state transition threshold value $V_{th0\ actual}$ and the apparent state transition threshold value $V_{th1\ actual}$ which one has a higher absolute value and with a value lower than the higher absolute value. Then, the reading signal is applied to the source line SL or the bit line BL.

Specifically, since $|V_{th0\ actual}|<|V_{th1\ actual}|$, the reading signal that has a polarity when a potential exceeding the apparent state transition threshold value $V_{th1\ actual}$ is applied to the variable resistance element 20, or more specifically a polarity when a current flows from the electrode 21 to the electrode 22 in the variable resistance element 20, and which has a value lower than the absolute value of the apparent state transition threshold value $V_{th1\ actual}$ is applied to the source line SL or the bit line BL.

Incidentally, a method of setting the magnitude of the reading signal may be a conventional method, and therefore description thereof will herein be omitted.

When information is read from the variable resistance element 20 using the thus set reading signal, since the magnitude of the reading signal is lower than the absolute value of the apparent state transition threshold value $V_{th1\ actual}$, the magnitude of the reading signal does not exceed the apparent state transition threshold value $V_{th1\ actual}$. In addition, because the polarity of the reading signal is different from that of the apparent state transition threshold value $V_{th0\ actual}$, the magnitude of the reading signal does not exceed the apparent state transition threshold value $V_{th0\ actual}$.

Thus, erroneous writing, destruction of stored information or the like does not occur in the recording layer 23 of the variable resistance element 20 when the information is read from the variable resistance element 20.

In addition, since the reading signal is applied with the polarity of one of the apparent state transition threshold value $V_{th0\ actual}$ and the apparent state transition threshold value $V_{th1\ actual}$ which one has the higher absolute value, the magnitude of the reading signal can be set higher as compared with a case where the reading signal is applied with the polarity of the apparent state transition threshold value having a lower absolute value. That is, when $|V_{th0\ actual}|<|V_{th1\ actual}|$, it suffices for the magnitude of the reading signal not to exceed $|V_{th1\ actual}|$, and because the polarity of the reading signal is different from that of the apparent state transition threshold value $V_{th0\ actual}$, the magnitude of the reading signal exceeding $|V_{th0\ actual}|$ does not present a problem.

Thus, even when the apparent state transition threshold value $V_{th0\ actual}$ and the apparent state transition threshold value $V_{th1\ actual}$ do not coincide with each other, and an asymmetric hysteresis loop occurs, the magnitude of the reading signal can be set to a maximum in a range in which the magnitude of the reading signal does not exceed the state transition threshold value of the same polarity. That is, even when the hysteresis loop is asymmetric, it is possible to obtain a sufficient signal level at the time of information reading while avoiding erroneous writing of information, destruction of stored information or the like in the variable resistance element 20. Therefore sufficient safety at the time of information reading can be ensured.

It is to be noted that while description in the first embodiment and the second embodiment has been made by taking preferred concrete examples for carrying out the present invention, the present invention is not limited to contents therein, and is susceptible of changes as appropriate without departing from the spirit of the present invention. For example, the laminated structures in the recording layers 13 and 23 are not limited to those described in the respective embodiments. The present invention is applicable to variable resistance elements whose resistance value is changed reversibly and whose state transition threshold values cause an asymmetric hysteresis loop.

It should be understood by those skilled in the art that various modifications, combinations, sub-combinations and alterations may occur depending on design requirements and other factors insofar as they are within the scope of the appended claims or the equivalents thereof.

What is claimed is:

1. A storage apparatus including a variable resistance element having a recording layer between two electrodes, wherein in said variable resistance element, a resistance value of said recording layer is reversibly changed to one of a value in a high-resistance state and a value in a low-resistance state by applying potentials of different polarities to said two electrodes, and an absolute value of a threshold value of an applied signal at a time of change from said high-resistance state to said low-resistance state and an absolute value of a threshold value of an applied signal at a time of change from said low-resistance state to said high-resistance state differ from each other, and a reading signal for detecting the resistance value of said recording layer in said variable resistance element is applied with a polarity of one of the threshold values of said applied signals which one has a higher absolute value and with a value lower than said absolute value.

2. A storage apparatus including a plurality of variable resistance elements having a recording layer between two electrodes, one of said two electrodes being connected to a source line, and the other of said two electrodes being connected to a bit line via a selecting transistor, wherein in each variable resistance element, a resistance value of said recording layer is reversibly changed to one of a value in a high-resistance state and a value in a low-resistance state by applying potentials of different polarities to said two electrodes, and an absolute value of a threshold value of an applied signal at a time of change from said high-resistance state to said low-resistance state and an absolute value of a threshold value of an applied signal at a time of change from said low-resistance state to said high-resistance state differ from each other, at a time of information writing, by setting said source line to one of a reference voltage and a reference current and applying a writing signal having one of a different voltage value and a different current value to said bit line, potentials of different polarities are applied to said two electrodes in said variable resistance element selected by said selecting transistor, whereby the resistance value of said recording layer in said variable resistance element is changed, and at a time of information reading, a reading signal for detecting the resistance value of said recording layer in said variable resistance element is applied to one of said source line and said bit line such that said reading signal is applied with a polarity of one of the threshold values of said applied signals which one has a higher absolute value and with a value lower than said absolute value, to said variable resistance element selected by said selecting transistor.

3. The storage apparatus as claimed in claim 2, wherein said recording layer in said variable resistance element includes at least a fixed layer as a magnetic layer in which a direction of magnetization is fixed, and a free layer as a magnetic layer in which a direction of magnetization is changed.

4. The storage apparatus as claimed in claim 2, wherein said recording layer in said variable resistance element includes at least an ion source layer including one or more kinds of element selected from Ag, Cu, and Zn and one or more kinds of element selected from S, Se, and Te.

* * * * *